United States Patent [19]
Hoshino

[11] Patent Number: 5,714,884
[45] Date of Patent: Feb. 3, 1998

[54] MAGNETIC RESONANCE IMAGING APPARATUS WITH AUTOMATIC LOAD TIMING DETERMINATION

[75] Inventor: Tsutomu Hoshino, Ootawara, Japan

[73] Assignee: Kabushiki Kaisha Toshiba, Kanagawa-Ken, Japan

[21] Appl. No.: 268,786

[22] Filed: Jun. 30, 1994

[30] Foreign Application Priority Data

Jul. 5, 1993 [JP] Japan .................. 5-165356

[51] Int. Cl.$^6$ .................. G01V 3/00; G01V 3/14
[52] U.S. Cl. .................. 324/309; 324/307; 324/318; 324/322
[58] Field of Search .................. 324/307, 309, 324/318, 322

[56] References Cited

U.S. PATENT DOCUMENTS

| | | | |
|---|---|---|---|
| 4,727,882 | 3/1988 | Scheider et al. | 324/309 X |
| 4,878,499 | 11/1989 | Suzuki et al. | 324/309 X |
| 4,958,637 | 9/1990 | Aritomi | 324/309 X |
| 4,981,137 | 1/1991 | Kondo et al. | 324/318 X |
| 5,134,373 | 7/1992 | Tsuruno et al. | 324/309 |
| 5,349,296 | 9/1994 | Cikotte et al. | 324/309 |
| 5,352,979 | 10/1994 | Conturo | 324/309 X |

OTHER PUBLICATIONS

Japanese Journal of Magnetic Resonance in Medicine vol. 12, Suppl.–2, p. 217, Keiko Kaise, et al. Ocrt. 27, 1992.

Primary Examiner—Sandra L. O'Shea
Assistant Examiner—Mack Haynes
Attorney, Agent, or Firm—Limbach & Limbach L.L.P.

[57] ABSTRACT

Time charts describe time points at which a gradient magnetic field is generated, a radio frequency pulse is sent, a magnetic resonance signal is received, and a load is provided to a patient. At the respective time points described in the time charts, gradient magnetic field coil generates the gradient magnetic field, transmitting/receiving coil sends the radio frequency pulse and receives the magnetic resonance signal, and load providing device provides the load to the patient.

12 Claims, 8 Drawing Sheets

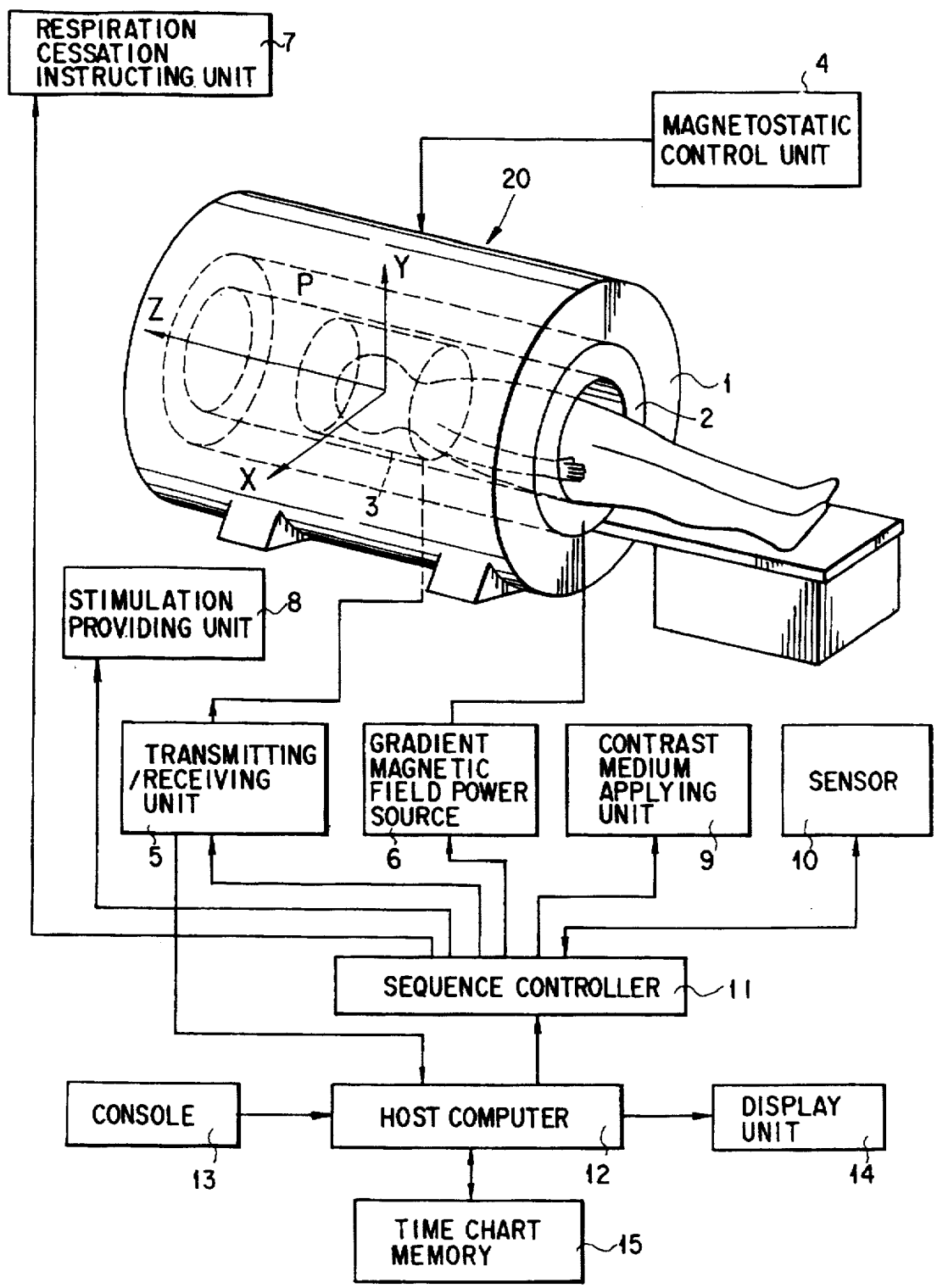
F I G. 1

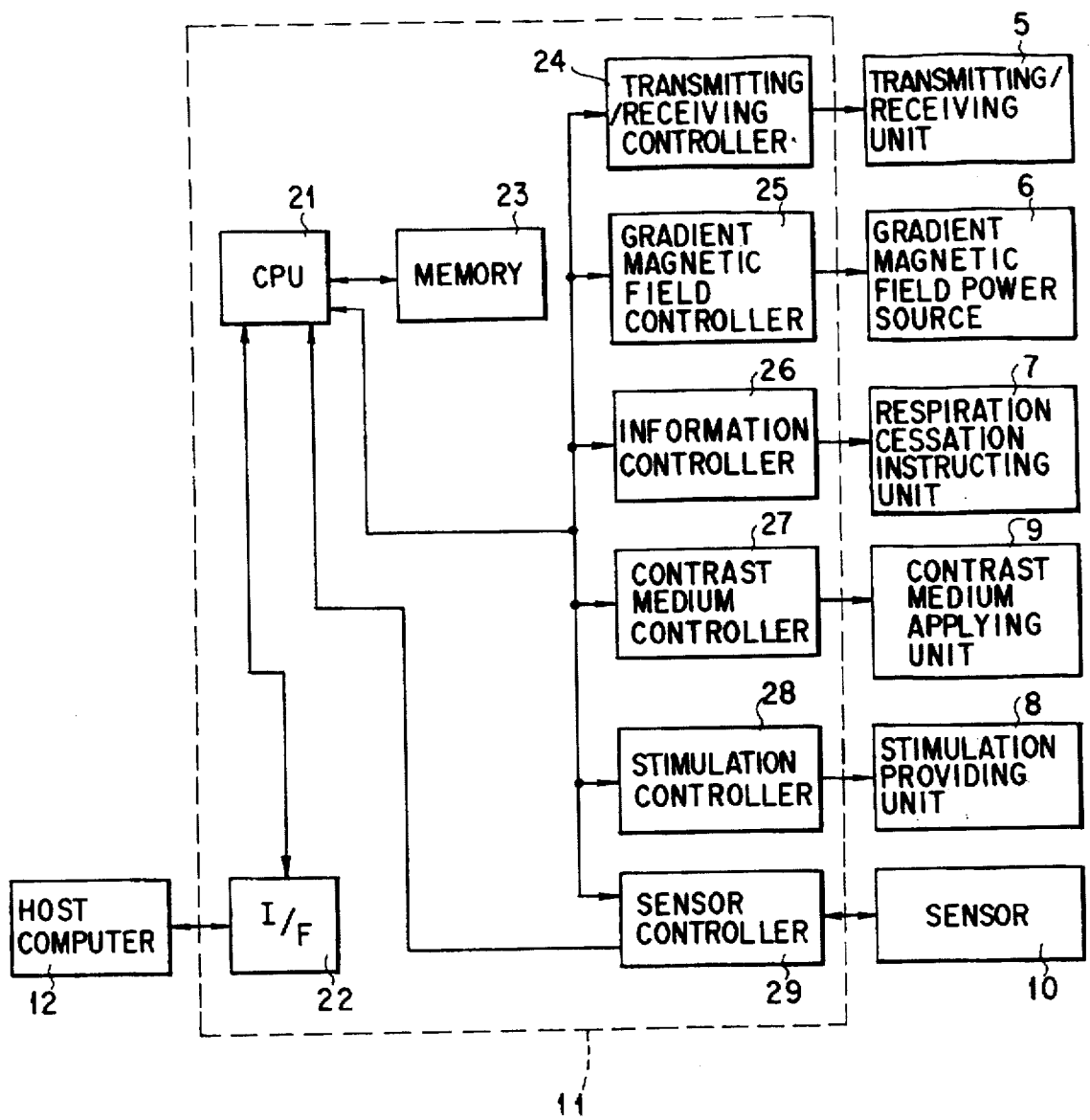
F I G. 2

| TIME (μs) | RF | Gs | Ge | Gr | BH |
|---:|---:|---:|---:|---:|---:|
| −5000000 | | | | | 1 |
| 0 | | +4000 | | | |
| +1000 | 90−44 | | | | |
| +2000 | | 0 | | | |
| +2200 | | −4200 | +4000 | −6250 | |
| +3200 | | 0 | 0 | 0 | |
| +3400 | | | | +2500 | |
| +8900 | | | −4000 | 0 | |
| +9900 | | | 0 | | |
| ⋮ | | | | | |
| +30000000 | | | | | 0 |
F I G. 3A
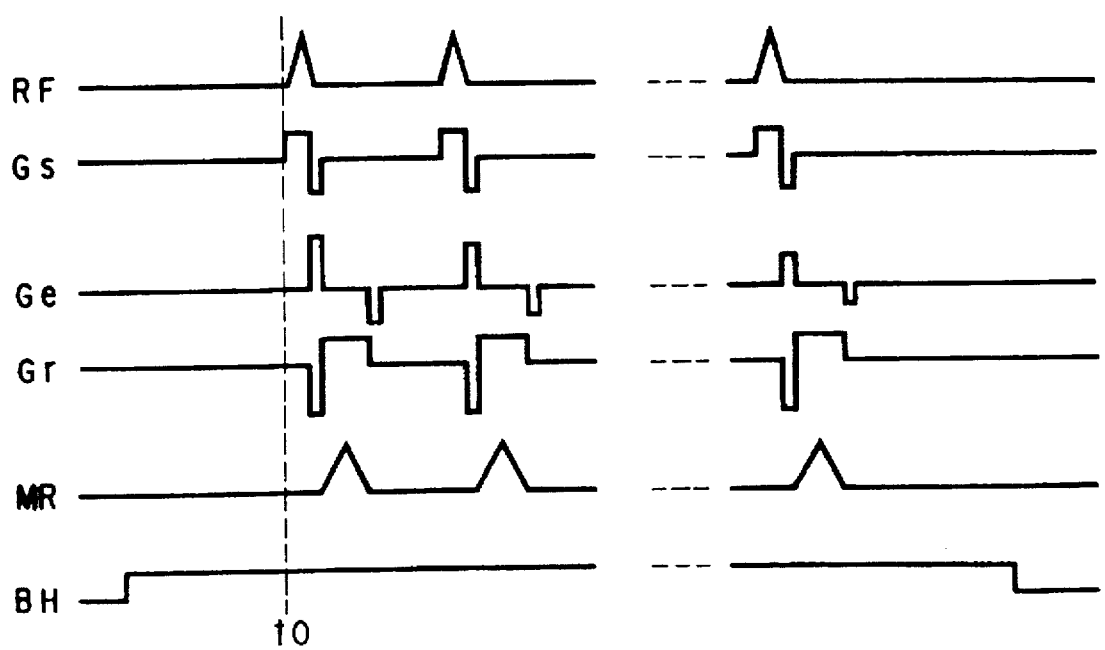
F I G. 3B

| TIME (μs) | RF | Gs | Ge | Gr | BH | St1 |
|---|---|---|---|---|---|---|
| -5000000 | | | | | 1 | |
| -500000 | | | | | | 1 |
| -400000 | | | | | | 0 |
| 0 | | +4000 | | | | |
| +1000 | 90-44 | | | | | |
| +2000 | | 0 | | | | |
| +2200 | | -4200 | +4000 | -6250 | | |
| +3200 | | 0 | 0 | 0 | | |
| +3400 | | | | +2500 | | |
| +8900 | | | -4000 | 0 | | |
| +9900 | | | 0 | | | |
| | | | | | | |
| +30000000 | | | | | 0 | |
F I G. 4A
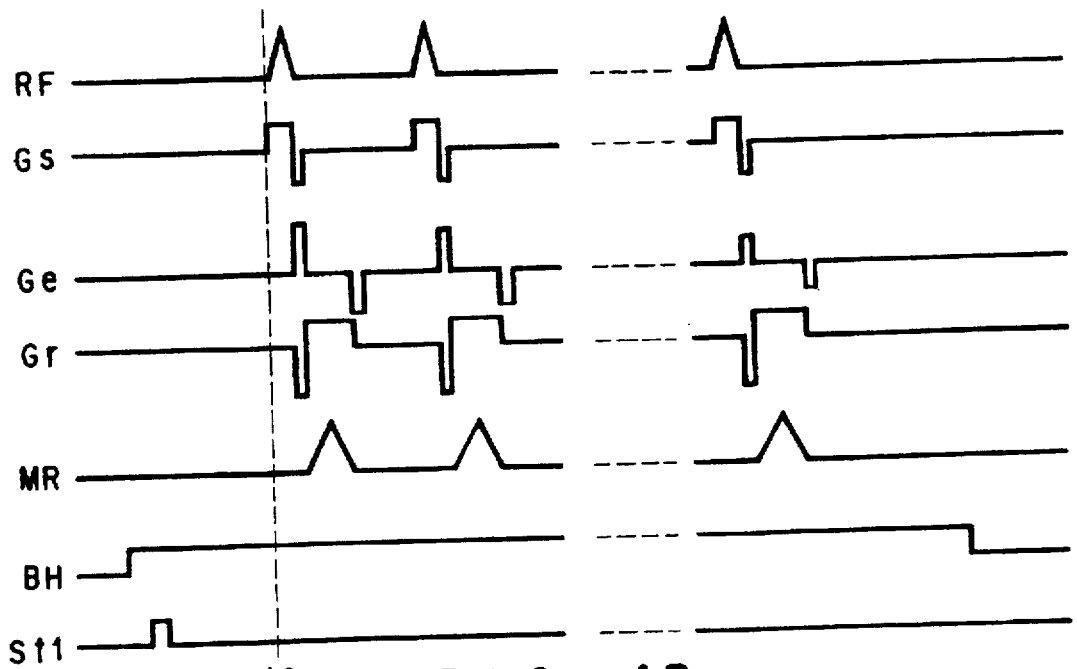
F I G. 4B

| TIME (μs) | RF | Gs | Ge | Gr | BH | St3 |
|---|---|---|---|---|---|---|
| -5000000 | | | | | 1 | |
| -450000 | | | | | | 1 |
| -350000 | | | | | | 0 |
| 0 | | +4000 | | | | |
| +1000 | 90-44 | | | | | |
| +2000 | | 0 | | | | |
| +3200 | | -4200 | +4000 | -6250 | | |
| +4200 | | 0 | 0 | 0 | | |
| +4400 | | | | +2500 | | |
| +8900 | | | -4000 | 0 | | |
| +9900 | | | 0 | | | |
| ⋮ | | | | | | |
| +30000000 | | | | | 0 | |
F I G. 5A
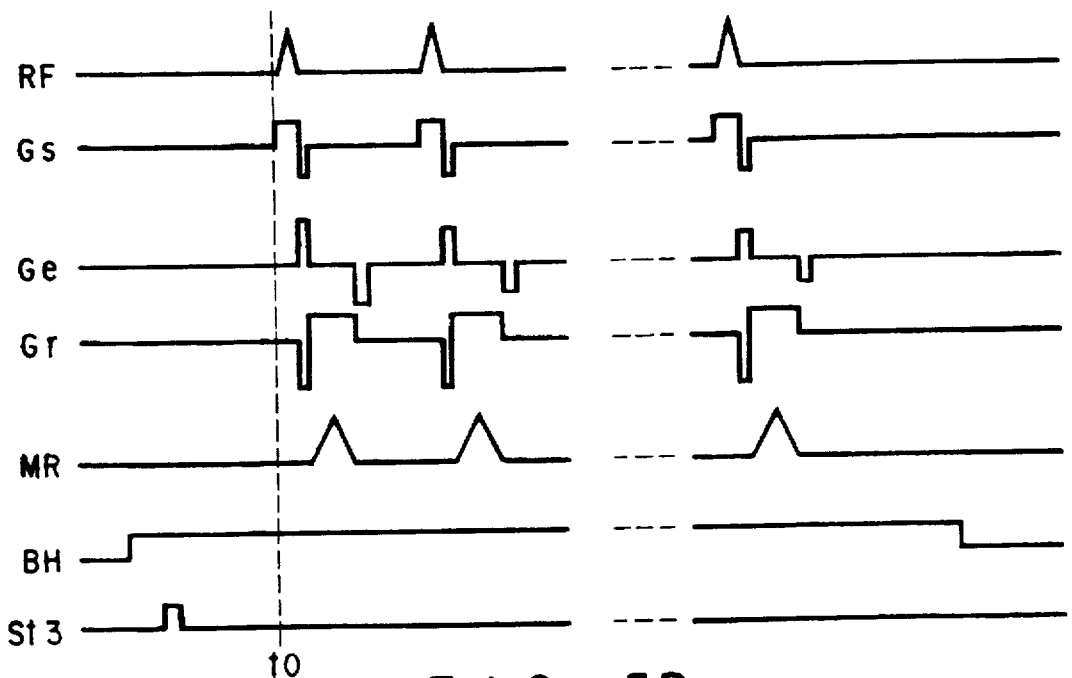
F I G. 5B

| TIME (μs) | RF | Gs | Ge | Gr | BH | St2 |
|---|---|---|---|---|---|---|
| −5000000 | | | | | 1 | |
| −420000 | | | | | | 1 |
| −200000 | | | | | | 0 |
| 0 | | +4000 | | | | |
| +1000 | 90−44 | | | | | |
| +2000 | | 0 | | | | |
| +2200 | | −4200 | +4000 | −6250 | | |
| +3200 | | 0 | 0 | 0 | | |
| +3400 | | | | +2500 | | |
| +8900 | | | −4000 | 0 | | |
| +9900 | | | 0 | | | |
| ⋮ | | | | | | |
| +30000000 | | | | | 0 | |

| TIME (µs) | RF | Gs | Ge | Gr | BH | SH |
|---|---|---|---|---|---|---|
| −5000000 | | | | | 1 | |
| −1000000 | | | | | | 1 |
| −600000 | | | | | | 0 |
| 0 | | +4000 | | | | |
| +1000 | 90−44 | | | | | |
| +2000 | | 0 | | | | |
| +2200 | | −4200 | +4000 | −6250 | | |
| +3200 | | 0 | 0 | 0 | | |
| +3400 | | | | +2500 | | |
| +8900 | | | −4000 | 0 | | |
| +9900 | | | 0 | | | |
| | | | | | | |
| +30000000 | | | | | 0 | |
F I G. 7A
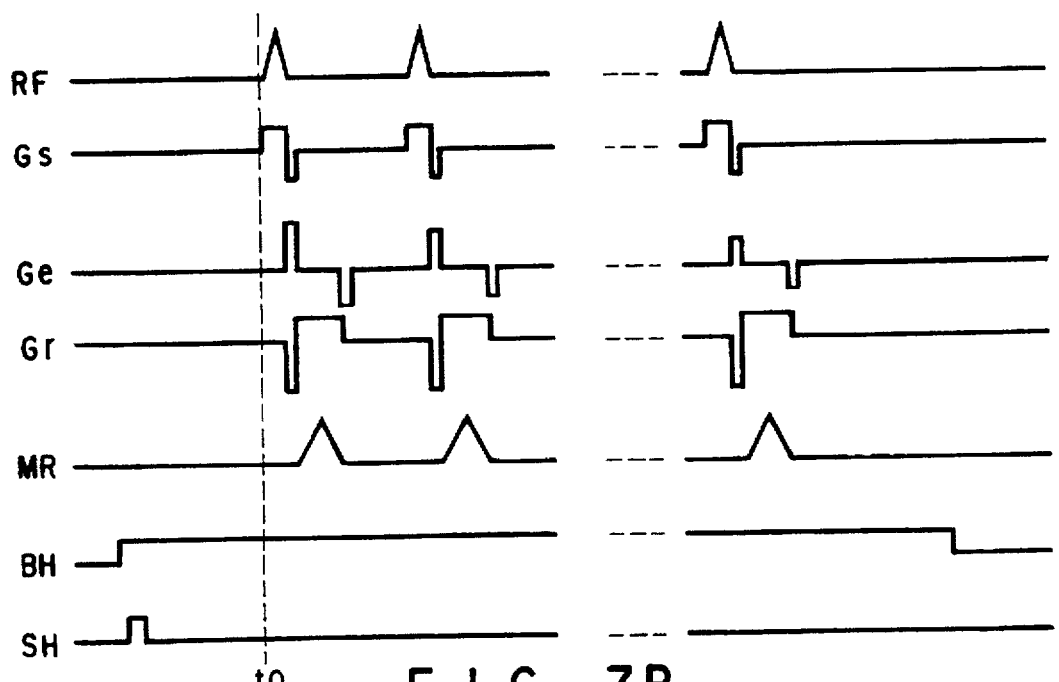
F I G. 7B

MAGNETIC RESONANCE IMAGING APPARATUS WITH AUTOMATIC LOAD TIMING DETERMINATION

BACKGROUND OF THE INVENTION

1. Field of the Invention

This invention relates to a magnetic resonance imaging apparatus.

2. Description of the Related Art

Magnetic resonance is a phenomenon exhibited in a static magnetic field, in which certain atomic nucleus each having a small nuclear spin and a small magnetic moment absorb magnetic energy at natural resonant frequencies, and output a magnetic resonant signal when they are restored to their original states. A magnetic resonance imaging apparatus uses the output magnetic resonance signals to visualize a desired portion of an object to be inspected.

In a spin-echo method, for instance, a 90° radio frequency pulse and a 180° radio frequency pulse are applied to an object located in a static magnetic field at an interval of Te/2 (Te is the time period of echo), and a magnetic resonance signal is generated as a spin echo signal when the Te has elapsed after the application of the 90° pulse. The magnetic resonance signal is detected as the sum of signals of all spins. Thus, applying a slice selective gradient magnetic field Gs, a phase encoding gradient magnetic field Ge and a readout gradient magnetic field Gr to the object enables spatial data (as a frequency difference) to be imparted to the magnetic resonance signal. The time points of the radio frequency pulse and the gradient magnetic fields are controlled by a computer, since they must be controlled in microsecond order.

Recently, the scope of the application of the magnetic resonance imaging has extended greatly as a result of the development of various imaging methods such as the brain functional imaging method or the imaging method using contrast medium. The brain functional imaging method can obtain data relating to reactions to stimulations such as light, pain, etc. On the other hand, the other method uses contrast mediums such as water, air, pure oxygen, a solution containing a paramagnetic material, and $Mn^{2+}$, etc, to visualize, at high contrast, a particular portion such as a digestive organ, a respiratory organ, blood vessels, etc.

In the brain functional imaging method, it is important to start data-sampling at an appropriate point of time after a stimulation is applied to an object. If the data-sampling is initiated at an inappropriate time, diagnostic accuracy will be lowered. Further, in the method using contrast medium, data-sampling should start when a contrast medium injected into the object has reached the target portion, or in a time period during which the medium remains at the target portion. In the conventional cases, the starting point for data-sampling is manually controlled by the operator, and this inevitably results in a heavier work load for the operator from the view point of time management. Moreover, in the case of manual operation, data-sampling may well be performed at different time points, which makes it difficult to repeat data-sampling under the same conditions.

In addition, the MRI has a drawback in that it requires a long period of time for scanning. This will raise a "mis registration problem" resulting from involuntary movements such as a heartbeat or respiration. To solve the problem, the operator instructs the subject to cease breathing while scanning. This instruction is given with the use of a speaker, which likewise results in a heavier work load on the operator from the view point of time management.

SUMMARY OF THE INVENTION

The invention has been developed to solve the above problems, and aims to provide a magnetic resonance imaging apparatus capable of reducing the work load on the operator.

To attain the object, there is provided a magnetic resonance imaging apparatus comprising:

static magnetic field generating means for generating a static magnetic field;

gradient magnetic field generating means for superposing a gradient magnetic field on the static magnetic field;

transmitting/receiving means for transmitting a radio frequency pulse to an object located in the static magnetic field, and receiving a magnetic resonance signal from the object;

image reconstructing means for reconstructing an image with the use of the magnetic resonance signal received by the transmitting/receiving means;

load providing means for providing load to the object;

memory means storing time chart data items as regards generation of the gradient magnetic field, transmission of the radio frequency pulse, receipt of the magnetic resonance signal, and a time point at which the load is to be applied; and controlling means for controlling each of the gradient magnetic field generating means, the transmitting/receiving means and the load providing means in accordance to the time chart data items stored in the memory means.

The time charts describe time points at which a gradient magnetic field is generated, a radio frequency pulse is sent, a magnetic resonance signal is received, and a load is applied to an object. At the respective time points described in the time charts, gradient magnetic field generating means generates the gradient magnetic field, transmitting/receiving means sends the radio frequency pulse and receives the magnetic resonance signal, and load providing means applies the load to the object. Thus, it is not necessary for the operator to instruct load application to the object while performing time management. Further, loads can be applied to the object at respective optimal time points, and therefore data-sampling can be performed under the same conditions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a block diagram, showing a magnetic resonance imaging apparatus according to the embodiment of the invention;

FIG. 2 is a block diagram, showing a sequence controller shown in FIG. 1;

FIG. 3A is a table, showing a first time chart stored in a time chart memory shown in FIG. 1;

FIG. 3B is a view, showing the operation according to the time chart of FIG. 3A;

FIG. 4A is a table, showing a second time chart stored in the time chart memory shown in FIG. 1;

FIG. 4B is a view, showing the operation according to the time chart of FIG. 4A;

FIG. 5A is a table, showing a third time chart stored in the time chart memory shown in FIG. 1;

FIG. 5B is a view, showing the operation according to the time chart of FIG. 5A;

FIG. 7A is a table, showing a fifth time chart stored in the time chart memory shown in FIG. 1;

FIG. 7B is a view, showing the operation according to the time chart of FIG. 7A;

DETAILED DESCRIPTION OF THE PREFERRED EMBODIMENT

Figures 6A, 6B:
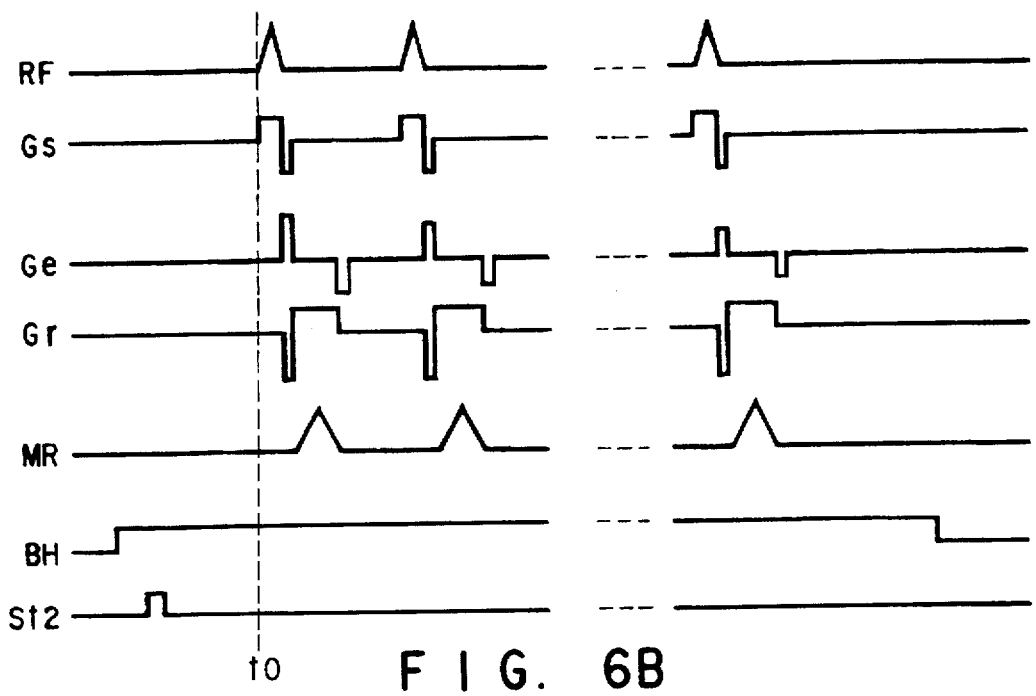
FIG. 6A is a table, showing a fourth time chart stored in the time chart memory shown in FIG. 1.
FIG. 6B is a view, showing the operation according to the time chart of FIG. 6A.

The embodiment of the invention will be explained with reference to the accompanying drawings.

FIG. 1 is a block diagram, showing a magnetic resonance imaging apparatus according to the embodiment of the invention. A cylindrical gantry 20 contains a static magnetic magnet 1, a gradient magnetic field coil 2 and a transmitting/receiving coil 3. One of a superconductive coil, a resistive coil and a permanent magnet is used as the static magnetic magnet 1. A static magnetic control unit 4 drives the static magnetic magnet 1 to generate a static magnetic field in the direction of the axis of an object or patient P. The gradient magnetic field coil 2 comprises an X-axis gradient magnetic field coil, a Y-axis gradient magnetic field coil and a Z-axis gradient magnetic field coil. The X-axis gradient magnetic field coil generates a gradient magnetic field Gx having a magnetic field intensity changing in the direction of an X-axis, which extends horizontal and perpendicular to the axis of the coil. The Y-axis gradient magnetic field coil generates a gradient magnetic field Gy having a magnetic field intensity changing in the direction of a Y-axis, which extends vertical. The Z-axis gradient magnetic field coil generates a gradient magnetic field Gz having a magnetic field intensity changing in the direction of a Z-axis, which extends horizontal and perpendicular to the X-axis. Thus, the Z-axis is generally set parallel to the axis of the patient P. A gradient magnetic field power source 6 can drive the X-axis gradient magnetic field coil, the Y-axis gradient magnetic field coil and the Z-axis gradient magnetic field coil, independently. The gradient magnetic fields Gx, Gy and Gz are used, for example, as a phase encoding gradient magnetic field Ge, a readout gradient magnetic field Gr and a slice selective gradient magnetic field Gs, respectively.

The transmitting/receiving coil 3 sends a radio frequency pulse in a radio frequency band (also called "RF pulse") to energize nuclear spins in a target portion of the patient, and also receives a magnetic resonance signal generated from the spins. The transmitting and receiving operations may be performed by different coils. A transmitting/receiving unit 5 is provided for driving the transmitting/receiving coil 3 to apply a radio frequency pulse, and receiving a magnetic resonance signal from the nuclear spins through the coil 3.

A load providing device provides to the patient P various kinds of load. Here, the load includes the cessation of respiration (breath-holding), the application of various kinds of stimulations and the application of a contrast medium. The load providing device comprises a respiration cessation instructing unit 7, a stimulation providing unit 8 and a contrast-medium injecting unit 9.

The respiration cessation instructing unit 7 sends the patient P a message indicating a request for the cessation of respiration or the release of the respiration cessation, using a voice message or a display message. In the case of using a voice message, the instructing unit 7 has a speaker located in a position in which it does not adversely affect the static magnetic field. Preferably, the unit 7 further has a non-magnetic tube for transmitting voice vibration (air vibration) from the speaker to the ears of the patient. More preferably, the unit 7 also has a noise insulating member having the function of insulating noise which occurs at the time of data-sampling (scanning). There is an ear-tap type (earphone-type) noise insulating member which is to be fitted in the external auditory meatus of the ear, or another type (headphone-type) of noise insulating member which covers the auricle of the ear.

On the other hand, in the case of using a display message, the message transmitting unit 7 has a display, such as a CRT, for displaying a message, and a non-magnetic optical system which comprises, for example, a glass fiber bundle or combined mirrors, for transmitting a display image on the display to the eyes of the patient P in the gantry 20. The combined mirrors include at least two mirrors—one located in front of the eyes of the patient P in the gantry 20, and the other for projecting a display image of the display onto the first-mentioned mirror.

Figure 8A:
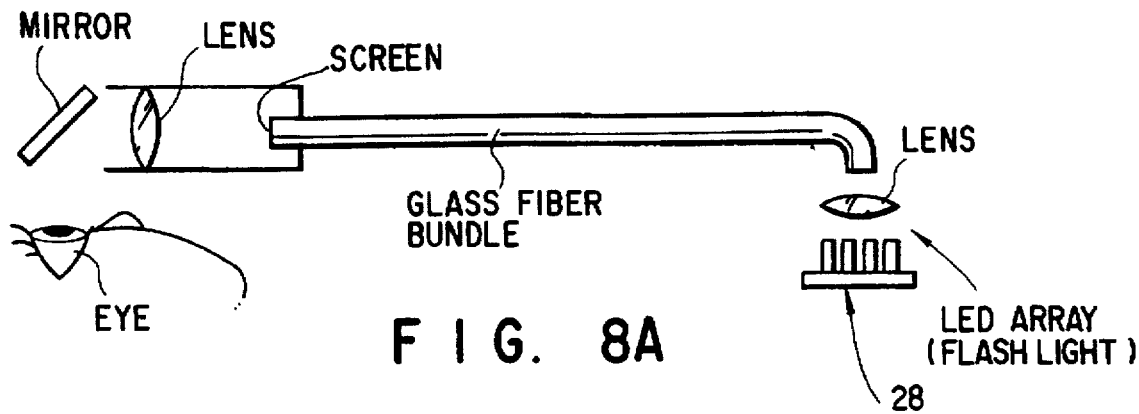
FIG. 8A is a schematic diagram showing a photic stimulation generating unit.
Figure 8B:
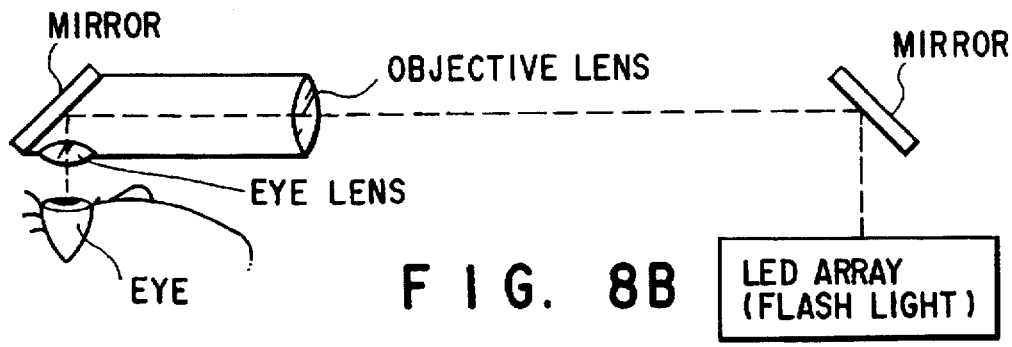
FIG. 8B is a schematic diagram, showing other photic stimulation generating unit.
Figure 9:
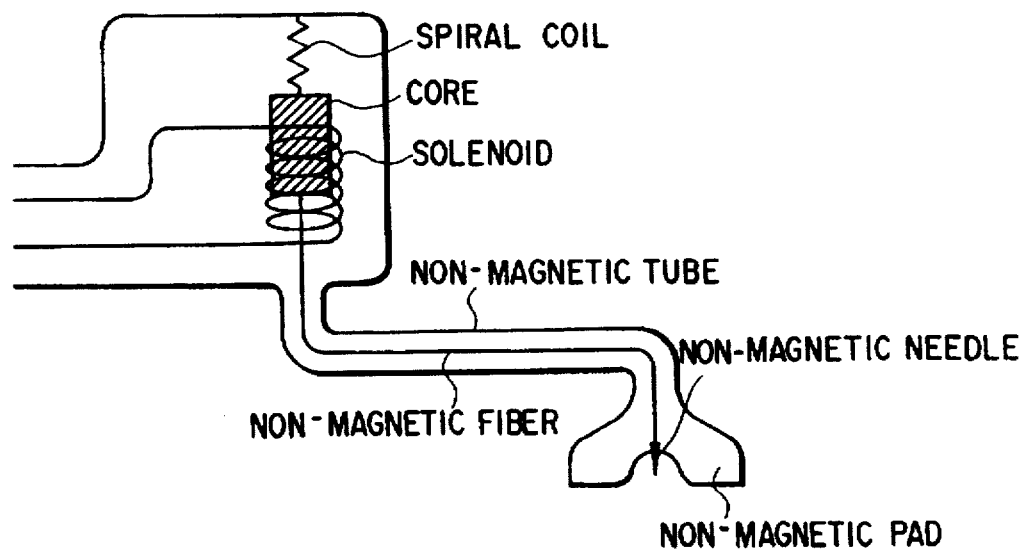
FIG. 9 is a schematic diagram, showing an algesthesia stimulation generating unit.

The stimulation providing unit 8 has a photic stimulation generating unit for providing light to the patient P, an algesthesia stimulation generating unit for providing pain to the patient P, and a warmth stimulation generating unit, which are operable independently. The photic stimulation generating unit has a display such as a flash light for emitting flash light, a LED array for displaying various figure patterns, and a non-magnetic optical system which comprises e.g. a glass fiber bundle (FIG. 8A) or combined mirrors (FIG. 8B), for transmitting a display image on the display to the eyes of the patient P in the gantry 20. The algesthesia stimulation generating unit has a needle and driving means, such as a piezoelectric element or a solenoid (FIG. 9), for moving the needle. The warmth stimulation generating unit is a heat generator mounted on the patient P.

The contrast medium injecting unit 9 injects a contrast medium into the patient P. Where a blood vessel is to be diagnosed, Gd, for example, is used as the contrast medium for reducing the value of a magnetic resonance signal, and is injected into the vein by an injector.

A sensor 10 measures an organic phenomenon of the patient P. The sensor 10 indicates an electrocardiograph, an electromyograph, a hemodynamometer, a respirometer and a meter for measuring perspiration, etc. The output signal of the sensor 10 is supplied to the sequence controller 11. The controller 11 controls the data-sampling on the basis of the output of the sensor 10, independent of a host computer 12.

For example, the controller 11 causes the data-sampling to be performed in synchronism with heartbeat or respiration, on the basis of the output signal of the sensor 10 (the electrocardiograph or the respirometer), and changes the level of load (light intensity, light application duration, algesthesia amount, pain application duration, temperature, heat generation duration, contrast medium dose per unit time), on the basis of the output signal of the sensor 10 (the hemodynamometer or the perspiration meter).

A console 13 is used by the operator to select a desired inspection item. There are inspection items such as a respiration cessation item, an inspection item for inspecting a reaction to light, an inspection item for inspecting a reaction to pain, an inspection item for inspecting a reaction to warmth, and an inspection item for emphasizing a particular portion by the use of a contrast medium.

A time chart memory 15 stores a plurality of time charts (time table) corresponding to the inspection items. All the time charts show time points (pulse sequence data) relating to the generation of the X-, Y- and Z-directional gradient magnetic fields, the transmission of excitation pulses, and the receipt of magnetic resonance signals. Specifically, a time chart corresponding to the respiration cessation item describes time points at which messages indicating requests for the cessation of respiration and its resumption are output, as well as pulse sequence data. A time chart corresponding to the inspection item for inspecting a reaction to light describes a time point at which the sense of light is stimulated, as well as pulse sequence data. A time chart corresponding to the inspection item for inspecting a reaction to pain describes a time point at which the algesthesia is provided, as well as pulse sequence data. A time chart corresponding to the inspection item for inspecting a reaction to warmth describes a time point at which the sense of warmth is provided, as well as pulse sequence data. A time chart corresponding to the inspection item for emphasizing a particular portion by the use of a contrast medium describes a time point at which a contrast medium is injected, as well as pulse sequence data.

FIGS. 3A, 4A, 5A, 6A and 7A show a plurality (here, five) of time charts stored in the time chart memory 15. Although each chart is made suitable to the case of using the field echo method as an imaging method, the invention is not limited to this. FIG. 3A shows a first time chart corresponding to the respiration cessation item (BH), and FIG. 3B shows the procedure of imaging performed in accordance with the time chart of FIG. 3A. FIG. 4A shows a second time chart corresponding to the respiration cessation item and the photic stimulation item (St1), and FIG. 4B shows the operation performed in accordance with the time chart of FIG. 4A. FIG. 5A shows a third time chart corresponding to the respiration cessation item and the algesthesia stimulation item (St2), and FIG. 5B shows the operation performed in accordance with the time chart of FIG. 5A. FIG. 6A shows a fourth time chart corresponding to the respiration cessation item and the warmth stimulation item (St3), and FIG. 6B shows the procedure of imaging performed in accordance with the time chart of FIG. 6A. FIG. 7A shows a fifth time chart corresponding to the respiration cessation item and the contrast medium injection item (SH), and FIG. 7B shows the procedure of imaging performed in accordance with the time chart of FIG. 7A. In these figures, RF represents a radio frequency pulse, Gs a slicing selective gradient magnetic field, Ge a phase-encoding gradient magnetic field, Gr a readout gradient magnetic field, BH a signal indicating the cessation of respiration, and St stimulation. The unit of time employed is μsec., and the unit of the intensity of each magnetic field employed is Hz/cm. As regards the radio frequency pulse RF, each time chart describes its flip angle (90 degrees in this case) and a number (No. 44 in this case) which indicates the spectrum of the frequency pulse. Each time chart also describes the medium intensity of each of the magnetic fields Gs, Ge and Gr, as well as the time point of occurrence thereof. Each time chart shows that the application of each gradient magnetic field, the cessation of respiration, the application of a stimulant, and the application of a contrast medium are continued to the time point indicated by 0. The time points at which the above operations are performed are indicated by (−, +) with respect to a reference time point. (−, +) means prior to or following the reference time point. The reference time point corresponds to a start time of GS.

The host computer 12 reconstructs an image with the use of a magnetic resonance signal received by the transmitting/receiving unit 5 through the transmitting/receiving coil 3. Further, the computer 12 reads from the memory 15 a time chart corresponding to an inspection item selected with the use of the console 13, and supplies the time chart data to the sequence controller 11.

The controller 11 decodes the time chart data from the host computer 12, thereby controlling the transmitting/receiving unit 5 and the gradient magnetic field power source 6 to apply voltage to the X-, Y- and Z-directional gradient magnetic fields at respective predetermined time points, to transmit a radio frequency pulse, and to receive a magnetic resonance signal from the patient P. When time points at which respiration is to be ceased and resumed are described in the time chart, the sequence controller 11 controls the respiration cessation instructing unit 7 so as to send the patient P messages indicating requests for the cessation of respiration and its resumption. On the other hand, when a time point at which a stimulation is to be provided is described in the time chart, the sequence controller 11 controls the stimulation providing unit 8 so as to apply the stimulant to the patient P at the described time point. Similarly, when a time point at which a contrast medium should be injected is described in the time chart, the controller 11 controls the contrast medium injecting unit 9 so as to inject the contrast medium into the patient P at the described time point.

FIG. 2 is a block diagram, showing the sequence controller 11. The time chart data from the host computer 12 is supplied via an interface (I/F) 22 to a CPU 21 incorporated in the controller 11. The time chart data is temporarily stored in a memory 23. The CPU 21 decodes the time chart data, and controls the gradient magnetic field power source 6 and a transmitting/receiving controller 24 for controlling the transmitting/receiving unit 5, so as to perform data-sampling. In other words, the CPU 21 controls a gradient magnetic field controller 25 so as to apply voltage to the X-, Y- and Z-directional gradient magnetic fields at respective predetermined time points, and also controls the transmitting/receiving controller 24 so as to send a radio frequency pulse and receive a magnetic resonance signal from the patient P. When time points at which respiration should be ceased and resumed are described in the time chart, the CPU 21 controls an information controller 26 so as to supply the patient P, at the respective predetermined time points, with messages indicating requests for the cessation of respiration and its resumption. In the case of using a voice message, the CPU 21 triggers the information controller 26, which stores voice message data items, so as to supply the respiration cessation instructing unit 7 with an electric signal indicative of a selected one of the voice message data items. In the case of displaying a message, the CPU 21 triggers the information controller 26, which stores character train data items, so as to supply the respiration cessation instructing unit 7 with a graphic signal indicative of a selected one of the character train data items. Further, when a time point at which a stimulant should be applied is described in the time chart, the CPU 21 controls a stimulation controller 28 so as to drive the stimulation providing unit 8 to apply the stimulation to the patient P at the described time point. Moreover, when a time point at which a contrast medium is to be injected is described in the time chart, the CPU 21 controls a contrast medium controller 27 so as to drive the contrast medium injecting unit 9 to inject the contrast medium into the patient P at the described time point. The CPU 21 controls a sensor controller 29 so as to drive the sensor 10 to measure an organic phenomenon of the patient P. The CPU 21 is responsive to an output signal from the sensor 10 (the electrocardiograph or the respirometer) for fine-adjusting the time points at which the imaging operations are performed, to effect a heartbeat synchronizing function and a respiration synchronizing function. Further, the CPU 21 is responsive to an output signal from the sensor 10 (the hemodynamometer or the perspiration meter) for changing the levels of loads (the instant light intensity, the light application duration, the instant pain amount, the pain application duration, the instant heat amount, the heat generation duration, and the contrast medium dose per unit time).

The operation of the apparatus constructed as above will now be explained. First, the operator selects a necessary inspection item through the console 13. When the respiration cessation item has been selected, the host computer 12 selectively reads the time chart data of FIG. 3A from the time chart memory 15, and stores the data in the memory 23 of the sequence controller 11. As is shown in FIG. 3B, the CPU 21 of the sequence controller 11 decodes the time chart data, and controls the transmitting/receiving controller 24 and the gradient magnetic field controller, so as to apply gradient magnetic fields at respective predetermined time points in the X-, Y- and Z-axis directions, send radio frequency pulses, and receive a magnetic resonance signal (MR) from the patient P. Thus, the imaging operations are performed. Although not being described in the time chart, the pulse sequence is repeated a predetermined number of times, e.g., about 128 times, with the encode amount changed each time. While executing the above photography operations, the CPU 21 controls the information controller 26 so as to drive the message transmitting unit 7 to inform the patient P five seconds before a reference time point that the patient should cease respiration, and to inform him of permission of to resume respiration when thirty seconds have elapsed after a reference time period has passed from the termination of the photography operations.

In the case where the photic stimulation item is selected together with the respiration cessation item, the host computer 12 selectively reads the time chart data of FIG. 4A from the time chart memory 15, and stores the data in the memory 23 of the sequence controller 11. As is shown in FIG. 4B, the CPU 21 of the sequence controller 11 decodes the time chart data, thereby performing the imaging operations, transmitting to the patient P messages indicating a request for the cessation of respiration and its resumption (release of the respiration cessation) at respective predetermined time points, and controlling the stimulation controller 28 so as to drive the photic stimulation generating unit to provide photic stimulation from 0.5 seconds to 0.4 seconds before the reference time point.

In the case where the algesthesia stimulating item is selected together with the respiration cessation item, the host computer 12 selectively reads the time chart data of FIG. 5A from the time chart memory 15, and stores the data in the memory 23 of the sequence controller 11. As is shown in FIG. 5B, the CPU 21 of the sequence controller 11 decodes the time chart data, thereby performing the imaging operations, transmitting to the patient P the messages indicating requests for the cessation of respiration and its resumption (release of the respiration cessation) at respective predetermined time points, and controlling the stimulation controller 28 so as to drive the algesthesia stimulating unit to provide algesthesia from 0.45 seconds to 0.35 seconds before the reference time point.

In the case where the warmth stimulation item is selected together with the respiration cessation item, the host computer 12 selectively reads the time chart data of FIG. 6A from the time chart memory 15, and stores the data in the memory 23 of the sequence controller 11. As is shown in FIG. 6B, the CPU 21 of the sequence controller 11 decodes the time chart data, thereby performing the imaging operations, transmitting to the patient P the messages indicating requests for the cessation of respiration and its resumption (release of the respiration cessation) at respective predetermined time points, and controlling the stimulation controller 28 so as to drive the warmth stimulation unit to provide warmth stimulation from 0.42 seconds to 0.2 seconds before the reference time point.

In the case where the contrast medium injection item is selected together with the respiration cessation item, the host computer 12 selectively reads the time chart data of FIG. 7A from the time chart memory 15, and stores the data in the memory 23 of the sequence controller 11. As is shown in FIG. 7B, the CPU 21 of the sequence controller 11 decodes the time chart data, thereby performing the imaging operations, transmitting to the patient P the messages indicating requests for the cessation of respiration and its resumption (release of the respiration cessation) at respective predetermined time points, and controlling the stimulation controller 28 so as to drive the contrast medium injecting unit to inject a contrast medium into the patient's body from 1 second to 0.4 seconds before the reference time point.

Further, the CPU 21 of the sequence controller 11 appropriately adjusts the data-sampling on the basis of output signals from the sensor 10, completely independent of the time chart. For example, the CPU 21 controls the transmitting/receiving controller 24 and the gradient magnetic field controller 25 so as to synchronize the cycle of the pulse sequence with the cycle of heartbeat or respiration on the basis of an output signal from the sensor 10 (the electrocardiograph or the respirometer). Moreover, when an output (indicative of blood pressure or the amount of perspiration) from the sensor 10 (the hemodynamometer or the perspiration meter) exceeds a threshold value, the CPU 21 controls the transmitting/receiving controller 24 and the gradient magnetic field controller 25 so as to urgently cease the data-sampling, and controls the information controller 26 so as to send a message indicating a request for the resumption of respiration.

As described above, the time charts employed in the embodiment describe time points at which loads are applied to a patient, as well as time points at which gradient magnetic fields are generated, a radio frequency signal is transmitted, and a magnetic resonance signal is received. In accordance with the time chart data items, the sequence controller 11 generates gradient magnetic fields, receives a magnetic resonance signal, and causes the load application units to apply load on the patient, at respective predetermined time points. Therefore, it is not necessary for the operator to apply loads on the patient while calculating optimal time points. As a result, the operator's load can be reduced. In addition, each load can be provided to the patient always at an optimal time point, with the result that data-sampling can be performed under substantially the same conditions, and hence substantially the same reproductivity can be expected.

Furthermore, since the data-sampling can be performed while observing organic phenomena of the patient, it can be performed in synchronism with heartbeat or respiration, and the patient can be prevented from being put into a dangerous situation.

The invention is not limited to the above, but may be modified in various manners. For example, although in the embodiment, loads are applied in accordance with time charts which describe time points at which the loads should be applied, the time points may be calculated by a program. Moreover, the time charts may be displayed on the display 14 so as to confirm them. An input unit may be used to perform time adjustment.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus comprising:

static magnetic field generating means for generating a static magnetic field;

gradient magnetic field generating means for generating a gradient magnetic field superimposed on the static magnetic field;

transmitting/receiving means for transmitting a radio frequency pulse to an object located in the static magnetic field, and receiving a magnetic resonance signal from the object;

image reconstructing means for reconstructing an image with the use of the magnetic resonance signals received by the transmitting/receiving means;

load applying means for applying a load to the object, the load being at least one of a photic stimulation, an algesthesia stimulation, a warmth stimulation and a contrast medium;

memory means for storing pulse sequence data regarding the timing of the generation of the gradient magnetic field, the timing of the transmission of the radio frequency pulse, the timing of the receipt of the magnetic resonance signal, and the timing of the application of the load to the object; and controlling means for controlling each of said gradient magnetic field generating means, said transmitting/receiving means and said load applying means in accordance with the pulse sequence data stored in the memory means to apply the load at a predetermined time.

2. The magnetic resonance imaging apparatus according to claim 1, wherein the load applying means sends to the object a message as the load which indicates the cessation of respiration.

3. The magnetic resonance imaging apparatus according to claim 2, wherein the load applying means sends a voice message to the object.

4. The magnetic resonance imaging apparatus according to claim 3, wherein the load applying means includes a speaker located in a position where it does not adversely affect the static magnetic field.

5. The magnetic resonance imaging apparatus according to claim 4, wherein the load applying means includes a non-magnetic tube for transmitting voice vibration from the speaker to an ear of the object.

6. The magnetic resonance imaging apparatus according to claim 5, wherein the load applying means includes a noise insulating member attached to a tip end of the tube for insulating noise.

7. The magnetic resonance imaging apparatus according to claim 2, wherein the load applying means has a display unit located in a position where it does not adversely affect the static magnetic field, for displaying a character message indicating a request for the cessation of respiration, and a non-magnetic optical system for transmitting the message on the display unit to a position in front of an eye of the object.

8. The magnetic resonance imaging apparatus according to claim 7, wherein the optical system is a bundle of glass fibers.

9. The magnetic resonance imaging apparatus according to claim 7, wherein the optical system is a combination of mirrors.

10. The magnetic resonance imaging apparatus according to claim 1, further comprising selection means to be operated by an operator for selecting one of a plurality of inspection items which correspond to different loads, and wherein said memory means stores a plurality of pulse sequence data items which correspond to different application timings, and said controlling means selectively reads from said memory means the pulse sequence data item corresponding to the selected one of the inspection items.

11. The magnetic resonance imaging apparatus according to claim 1, further comprising measuring means for measuring changes in organic phenomena of the object, and wherein said control means controls said load applying means so as to change the level of the load in accordance with the measurement result.

12. The magnetic resonance imaging apparatus according to claim 1, further comprising measuring means for measuring one of respiration and heartbeat, and wherein the controlling means adjusts, in accordance with the output of the measuring means, time points at which the gradient magnetic field is generated, the radio frequency pulse is sent, and the magnetic resonance signal is received.

* * * * *